(12) United States Patent
Woolsey

(10) Patent No.: US 6,730,842 B2
(45) Date of Patent: May 4, 2004

(54) SELF-EXTRACTION PANEL HINGE

(75) Inventor: Terrill L. Woolsey, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/025,245

(22) Filed: Dec. 19, 2001

(65) Prior Publication Data

US 2003/0111244 A1 Jun. 19, 2003

(51) Int. Cl.⁷ .............................. H02G 3/08; H05K 5/00
(52) U.S. Cl. .................. 174/50; 312/293.2; 312/293.3; 361/725
(58) Field of Search ................................. 361/816, 818, 361/683, 725; 174/35 R, 50; 312/293.2, 293.3, 223.1

(56) References Cited

U.S. PATENT DOCUMENTS 5,142,447 A * 8/1992 Cooke et al. ................ 361/685
5,349,132 A * 9/1994 Miller et al. ............... 174/35 R \* cited by examiner Primary Examiner—Hung V. Ngo
(74) Attorney, Agent, or Firm—Suiter West PC LLO

(57) ABSTRACT

The present invention is directed to a system for providing a removable access panel for utilization with electronic devices. The panel of the present invention is connected to the frame of an electronic device through the use of a pocket hinge which allows a curved extension on the cover to engage a corresponding curved surface included in the pocket. Utilization of the present invention allows for the electronic device to maintain its overall provide while providing a hinge system allowing for ease of access and removable functionality.

11 Claims, 7 Drawing Sheets

SELF-EXTRACTION PANEL HINGE

FIELD OF THE INVENTION

The present invention generally relates to the field of electronics, and particularly to a system for providing a self-extracting access panel.

BACKGROUND OF THE INVENTION

Presently, electronics and associated components are an ever increasing factor in our society as a whole. As electronics continue to permeate society specialty devices associated with the industry become more important due to the vast markets involved as well as solving problems specific to certain segments of the electronics field.

Currently, electronic chassis designs require that the internal electronic components be accessible in the case of failure, upgrade or the like. Additionally, chassis for electronics are specially designed to protect internal components from foreign contaminates, electromagnetic interference and the like. As a result of these requirements, chassis for electronic devices typically include either removable covers or hinged panels.

The major drawbacks to removing the cover of an electronic device are that the procedure is generally complicated and the increased likelyhood for contamination or other problems. Furthermore, depending on the conditions the electronic device may be large or located in a position ill-suited for removing the entire cover.

Alternatively, hinged panels allow for access to the internal components without having to remove the entire cover. Thus utilization of hinged panels allows for access to critical internal components without exposing the entire electronic device to contaminates experienced with removal of the entire cover of the electronic device. While hinged panels offer increased functionality, often such panels include drawbacks which negate their effectiveness for certain applications. For example, by including a hinged panel design as part of a frame or chassis the profile of the overall device often can become undesirable due to hinges and the like extending out from the frame, thus distorting the frame's overall profile and in certain circumstances requiring additional clearance space around the device.

An additional drawback to fixed hinged panels is that the rotation of the panel often may cause the panel to interfere with work to be conducted on the electronic device. For example, a hinged panel on a data storage system may disrupt the external profile of the frame thus interfearing with user access to internal components.

Further, hinged panels often require additional manufacturing which increases the overall cost to the manufacturer, which in-turn is passed on to the purchaser.

Therefore, it would be desirable to provide a removable access panel system that is capable of self-extracting the panel from the hinge to allow for easy access, while achieving lower cost manufacturing and reducing the overall profile of an electronic device employing the current invention.

SUMMARY OF THE INVENTION

Accordingly, the present invention is directed to a removable access panel system for utilization with electronic devices.

The removable access panel system of the present invention includes a frame suitable for containing an electronic component. The frame includes an aperture, which may be utilized to gain access for repairs or upgrades. Adjacent to the access aperture is at least one pocket with a generally arced surface. The generally arced surface of the pocket extends into the pocket from the side opposite the aperture.

Further, the removable access panel system includes a panel door designed to cover the associated aperture. The panel door is capable of rotating to obtain an open and a closed position. The panel door includes at least one extension. Individual extensions include a generally arced surface suitable for being accepted into the corresponding individual pocket included in the frame.

Additionally, the removable panel access system contains a mechanism for securing the panel door in a closed position. For example the panel door may be secured to the frame utilizing a latch.

In further embodiments, the panel door is capable of obtaining an open position such that the removable panel door is capable of self-extracting. For example, the panel door may be rotated from the closed position into a sufficient open position such that an extension on the panel door moves sufficiently outward to extract the panel door from the pocket included in the frame.

In further embodiments, individual pockets in the frame are disposed generally below the aperture when the aperture is aligned with gravity. For example, by arranging the removable access panel system in the present manner the panel door may rotate about the arced surface of the pocket in an efficient manner.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the present invention, examples of which are illustrated in the accompanying drawings.

Referring generally to FIGS. 1A through 6, exemplary embodiments of the present invention will be discussed, wherein a removable access panel system is utilized with an electronic device. The present invention allows for ease of access to interior electronic components without the need for exterior hinges mounted to the exterior frame of an electronic component. Utilization of the present invention allows for an electronic device employing the present invention to retain its profile.

Figure 1A:
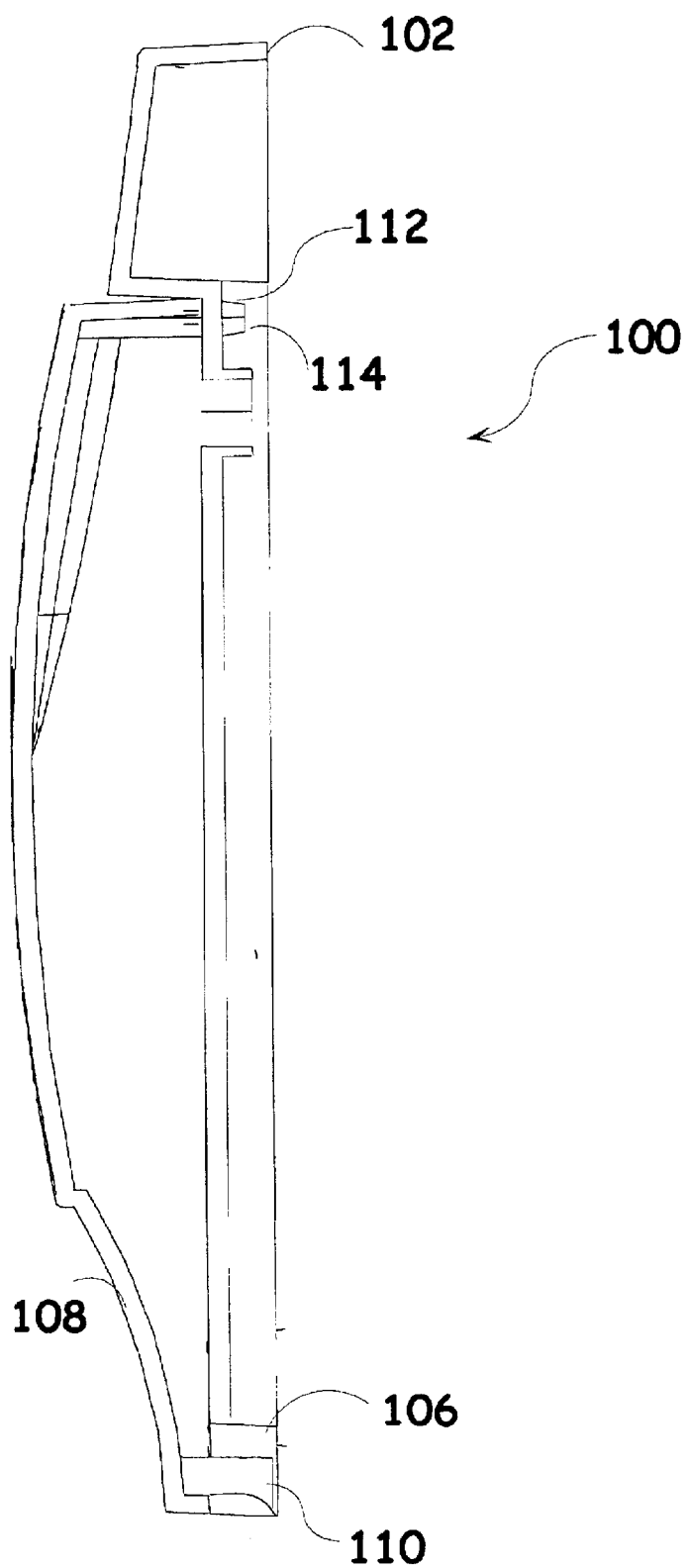
FIG. 1A is a side cut-out view of an exemplary embodiment of a removable access panel door system.
Figure 1B:
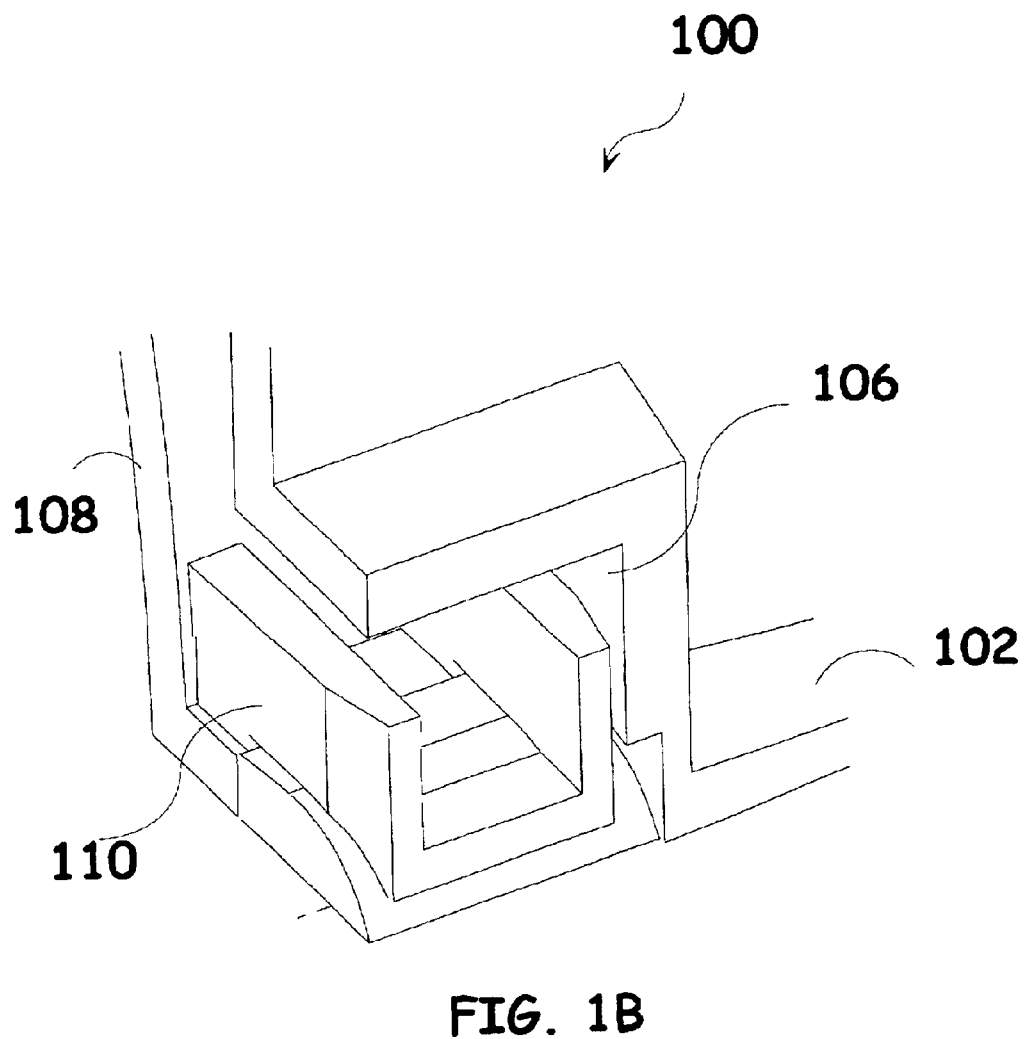
FIG. 1B is an exploded perspective view of an exemplary embodiment of a removable access panel door system.

Referring now to FIGS. 1A & B a removable access panel system 100 is discussed. In the present embodiment, the removable access panel system 100 includes a frame 102. The frame 102 is suitable for containing an electronic component, such as a data storage system. Included in the frame 102 is an aperture 104. For example, the aperture 104 is designed to allow for repair or upgrades to electronic components contained in the frame 102.

Adjacent to the aperture 104 is at least one pocket 106. The at least one pocket 106 includes an arced surface protruding into the pocket 106. In the present embodiment, the arced surface of the pocket 106 protrudes into the pocket from the surface of the pocket 106 generally opposite the aperture 104. In various embodiments, the arced surface of the pocket 106 may be better understood as being shaped similar to a quarter of a cylinder, running generally the length of the pocket 106, with a radius slightly smaller than that of the depth of the pocket 106. In these embodiments, the maximum protrusion into the pocket 106 by the arced surface occurs generally at the exterior of the frame 102.

Further, included in the removable access panel system 100 is a panel door 108. The panel door 108 in the present embodiment is capable of rotating to obtain an open position and a closed position. See generally FIGS. 1A & B, and 3A & B. The panel door 108 in the present embodiment is designed to cover the aperture 104.

Included in the panel door 108 is at least one extension 110. The at least one extension 110 includes a generally arced surface suitable for being accepted into the at least one pocket 106. The rotational motion of the panel door 108 including the at least one extension 110 causing the at least one extension 110 to interlock with the at least one pocket 106.

Further included in the removable access panel system 100 is a securing mechanism. The securing mechanism is capable of securing the panel door 108 to the frame 102 when the panel door 108 is orientated in the closed position. The securing mechanism is at least one of a latch 112, a screw, a slide lock and a twist lock. In the present embodiment, the securing mechanism is disposed on the opposite end of the panel door 108 than the at least one extension. The latch 612, as may be best understood in FIG. 6 wherein a panel door 608 is orientated in an opening position.

In further embodiments, the removable access panel system 100 includes an alignment device to aid in the alignment of the panel door 108 in relation to the aperture 104. Alignment devices include corresponding structures on the panel door 108 and the frame 102 limiting the panel door 108 from achieving closed positions with incorrect alignments. Examples of alignment devices include a pin 114 and hole, a frame protrusion or the like.

Figure 2:
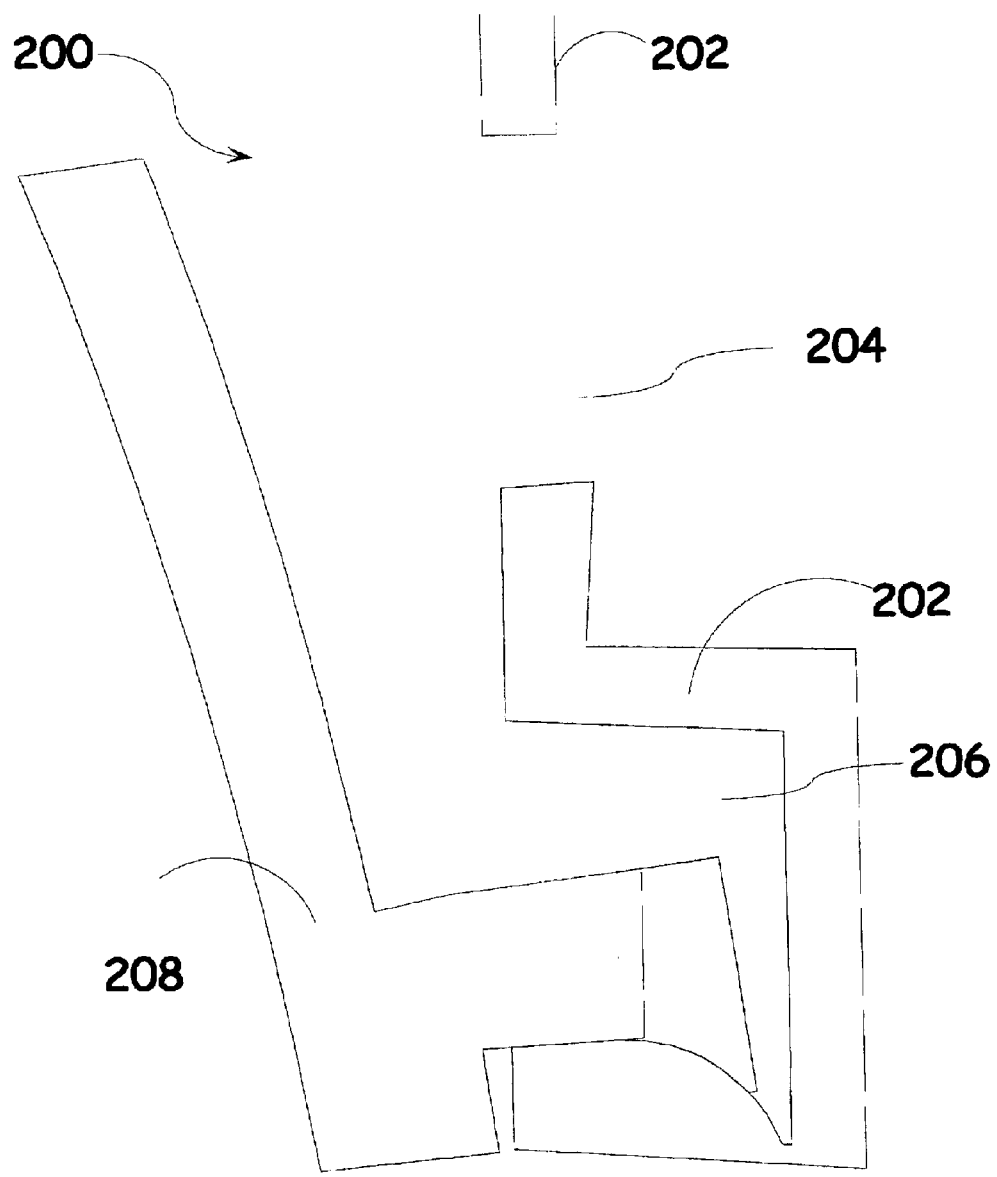
FIG. 2 is a side view of an exemplary embodiment of a panel door included in removable access panel door system, in an intermediate opening position.

Referring now to FIG. 2 an exemplary embodiment of the present invention is shown wherein a removable access panel system 200 will be discussed. The removable access panel system 200 of the present invention is illustrated with a panel door 208 orientated in an intermediate opening position. Further, in the present aspect of the invention a frame 202 suitable for containing an electrical component includes an aperture 204. Adjacent to the aperture 204 and disposed generally below the aperture 204 when aligned with gravity is at least one pocket 206 formed in the frame 202. When the aperture 204 and pocket 206 are disposed in the present arrangement with gravity acting in a downward fashion, whereby gravity would result generally in a free fall of the panel door 208 should the panel door 208 not be guided.

Figure 3A:
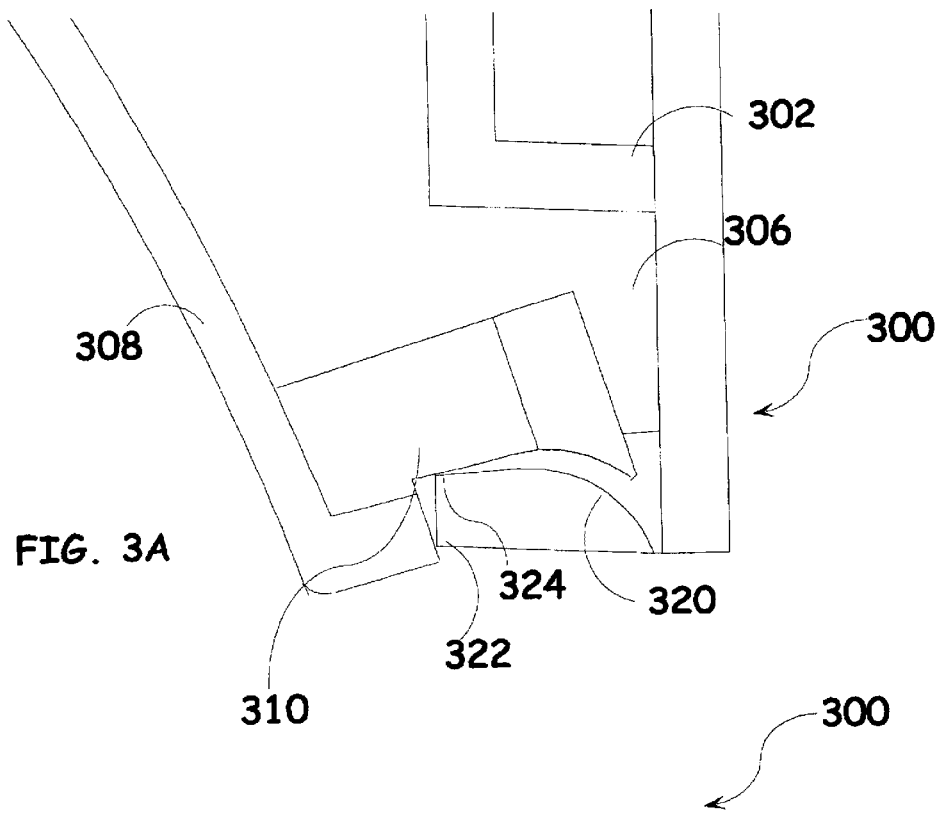
FIG. 3A is a side view of an exemplary embodiment of a panel door included in removable access panel door system, in a further intermediate opening position.
Figure 3B:
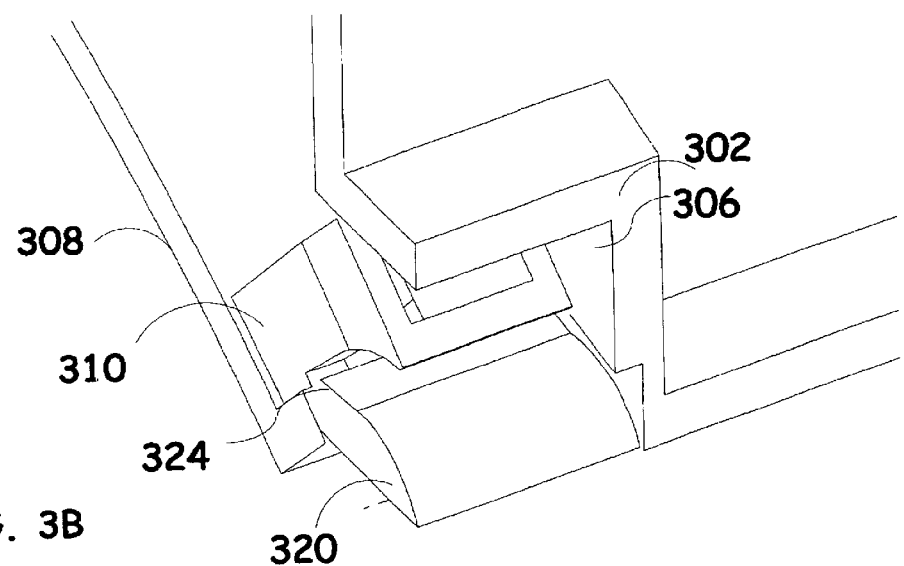
FIG. 3B is an exploded perspective view of an exemplary embodiment of a removable access panel door system wherein the panel door is in a further intermediate opening position.

Referring generally to FIGS. 3A & B an exemplary embodiment of the present invention is shown wherein a panel door 308 including at least one extension 310 is orientated in an intermediate opening position. For example, when a removable access panel system 300 is orientated with gravity such that at least one pocket 306 contained within a frame 302 is located in an adjacent position generally below an aperture 304 in the frame 302 the panel door 308, including at least one extension 310 may begin to exit the pocket 306.

As the panel door 308 rotates to obtain an open position the arced surface of the at least one extension 310 separates from the arced surface of the pocket 320. During this initial stage of opening the extension 310 may come in contact with an initial pivot point 324. The initial pivot point 324 may cause the hinge to being to move in a generally upward and outward direction from the pocket 306.

As the panel door rotates further, see generally FIGS. 1A & B, 2 the panel door comes in contact with a contact point on the frame 322. The contacting of the panel door and the frame further may cause the extension 310 to move generally upwards and outwards from the pocket. Once a sufficient rotation has been achieved the extension 310 may achieve a fully withdrawn position from the pocket. See FIG. 4. Furthermore, in embodiments when the removable access panel system is aligned with gravity, the general rotation of the panel door may occur as a result of the action of gravity on the panel door such that the self-extraction occurs virtually automatically.

Further, when the panel door 308 obtains a sufficient degree of opening the lower portion of the panel door 308 comes in contact with the frame 302, thus resulting in the panel door's at least one extension 310 moving in a generally outward direction from the at least one pocket 306.

Figure 4:
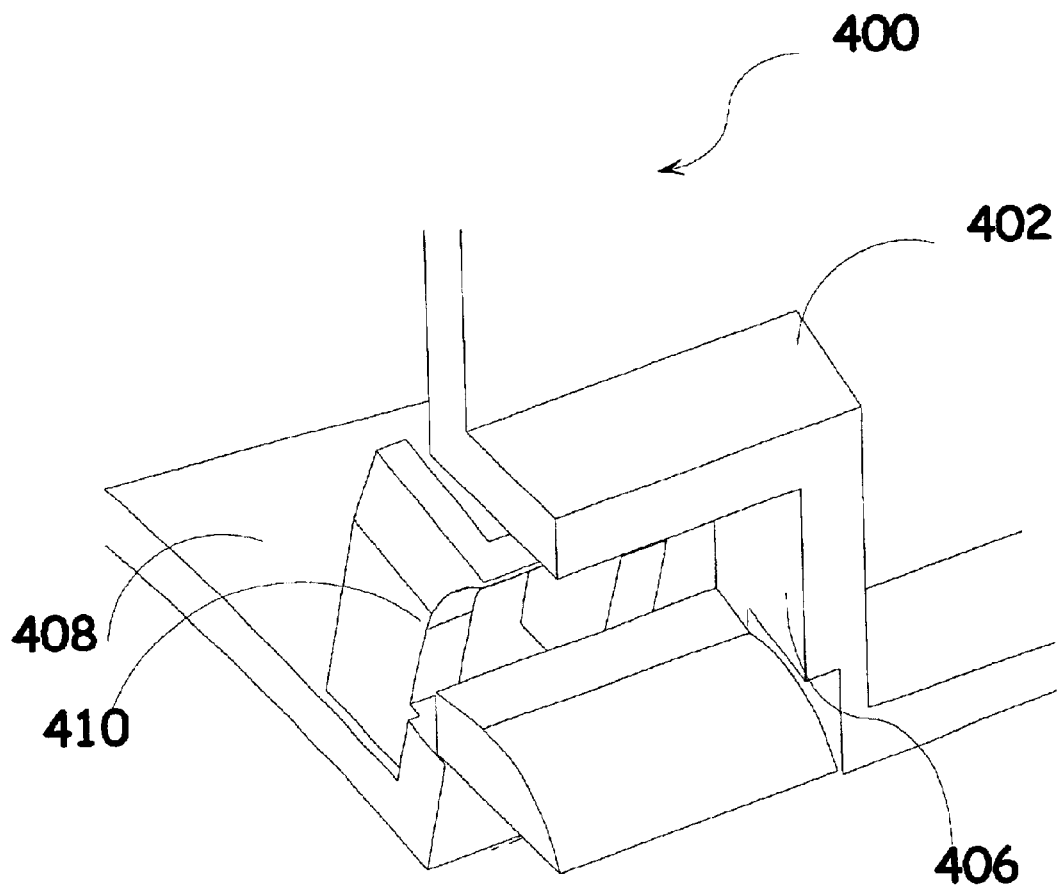
FIG. 4 is an exploded perspective view of an exemplary embodiment of a removable access panel door system wherein the panel door is generally in a open position.

Referring generally to FIG. 4, in the present orientation, upon obtaining a open position a panel door 408 including at least one extension 410 is self-extracted from a frame 402 including a pocket 406.

Figure 5:
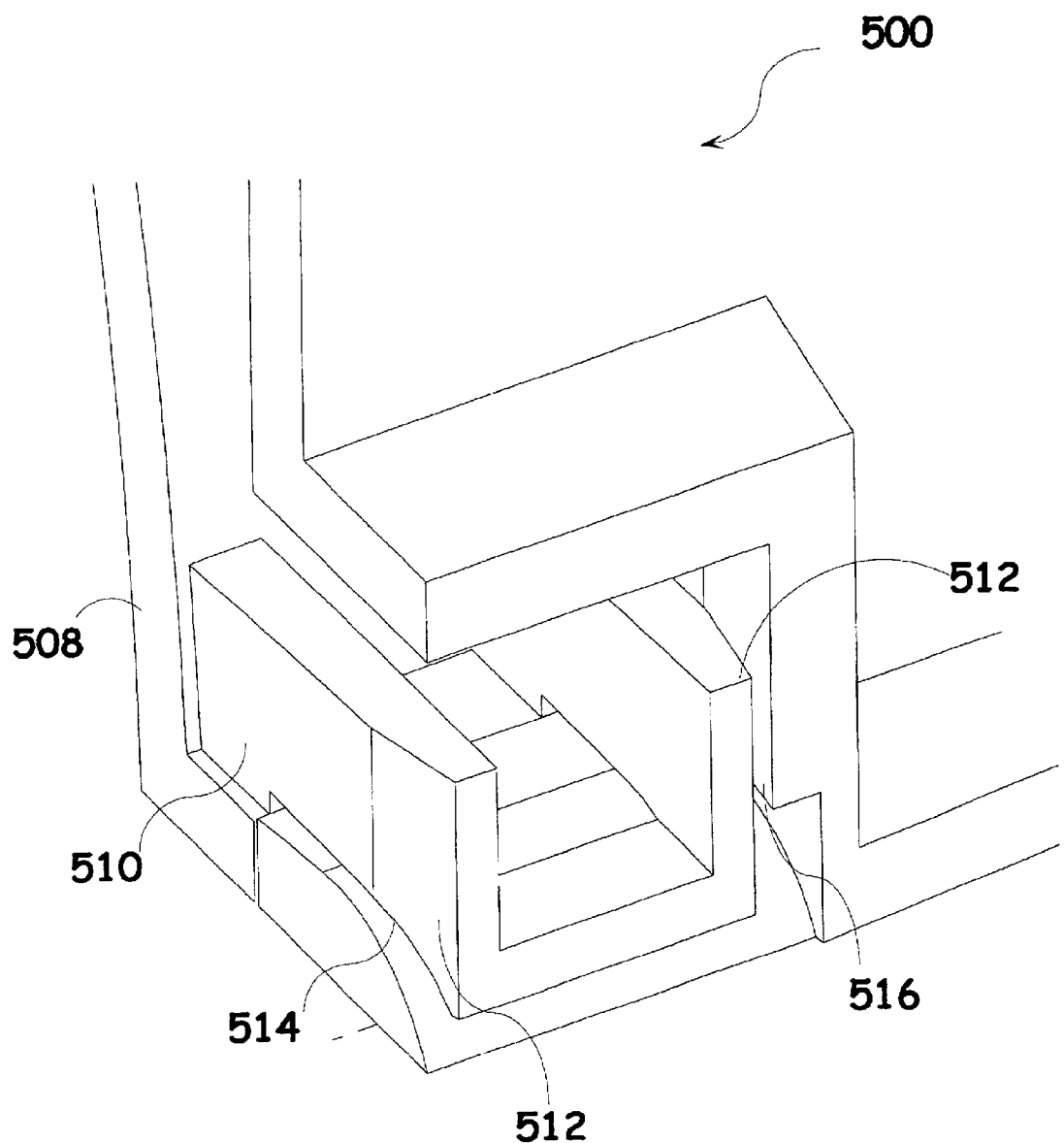
FIG. 5 is an exploded perspective view of an exemplary embodiment of an individual extension including a taper interacting generally with an individual pocket included in a frame.

Referring now to FIG. 5, an exemplary embodiment of the present invention will be discussed. In present embodiment, a removable access panel system 500 includes a panel door 508 with at least one extension 510. Further, individual extensions of the at least one extension 510 in the current aspect, includes tapers 512 on two surfaces of the extension generally perpendicular to the surface of the extension 510 with a generally arced surface 514. At least one pocket 506, is included in a frame 502. Each pocket 506 individually, contains two taper structures 516 capable of accepting the tapered surfaces of one extension 510. The interlock of the tapered portion of individual extension 510 with the corresponding tapered structures of the individual pocket further inhibiting the panel door 508 from lateral movement.

Figure 6:
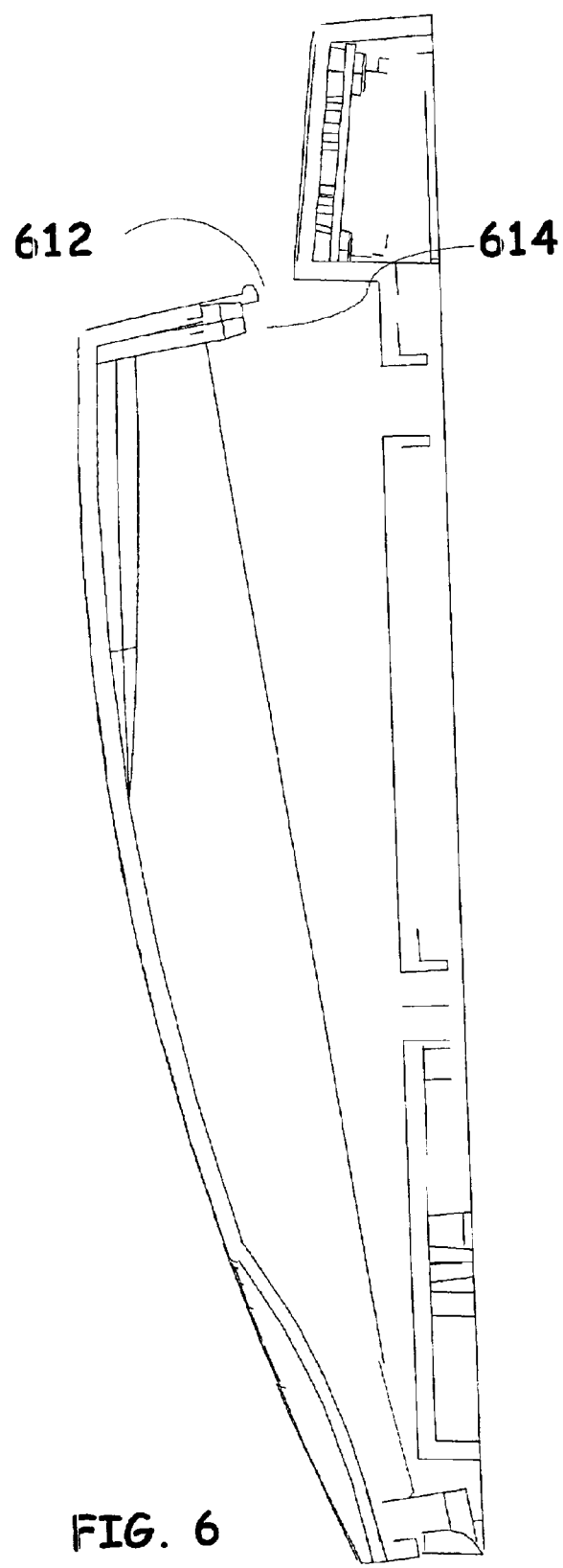
FIG. 6 is a side cut-out view of a removable access panel system, wherein a panel door is disposed in an intermediate open position; the access panel system further including a latch securing mechanism and an alignment device.

Referring generally to FIG. 6, a latch 612 securing mechanism capable of securing a panel door 608 to a frame 602 may be more clearly seen. Additionally, in the present embodiment a pin alignment device is employed to inhibit the panel door 608 from lateral movement.

It is believed that the SELF-EXTRACTION PANEL HINGE of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A removable access panel system, comprising:
a frame suitable for containing an electronic component, said frame including an aperture therein, said frame further including at least one pocket adjacent to said aperture, wherein said at least one pocket includes an arced surface protruding generally into the pocket from a side of the pocket generally opposite the aperture;
a panel door capable of rotating to obtain an open position and a closed position, the panel door including;
at least one extension with a generally arced surface suitable for being accepted into the at least one pocket; and
a securing mechanism capable of securing the panel door to the frame in the closed position wherein the at least one extension includes tapers on two surfaces of the extension generally perpendicular to the arced surface, wherein the at least one pocket includes corresponding tapered structures for accepting the at least one extension.

2. The removable access panel system of claim 1, further comprising a means for aligning the panel door to the frame.

3. The removable access panel system of claim 1, wherein the pocket is disposed generally below the aperture when the removable panel access system is aligned with gravity.

4. The removable access panel system of claim 1, wherein rotation of the panel door into an open position results in the at least one extension being removed from the pocket.

5. The removable access panel system of claim 1, wherein the securing mechanism is disposed on an opposite end of the panel door than the at least one extension.

6. A removable self-extracting panel system, comprising:
a frame for containing an electronic component, said frame including an aperture therein, said frame further including at least one pocket adjacent to said aperture, wherein said at least one pocket includes an arced surface protruding generally into the pocket from a side of the pocket generally opposite the aperture, whereby the innermost protrusion of the arced surface occurs at the outer surface of the frame;
a panel door capable of rotating to obtain an open position and a closed position, the panel door including;
at least one extension with a generally arced surface suitable for being accepted into the at least one pocket, wherein the at least one extension includes a taper on the sides of the extension generally perpendicular to the arced surface, wherein the at least one pocket includes corresponding tapered structures for accepting the at least one extension;
a securing mechanism capable of securing the panel door to the frame in the closed orientation; and
wherein the panel door is capable of self-extracting itself in the open position.

7. A removable access panel system, comprising:
a means for containing an electronic component including a means for accessing said electronic component therein, wherein said containing means further includes a means for accepting adjacent to said accessing means, said accepting means including an arced surface protruding into said accepting means from a side of the accepting means generally opposite said accessing means;
a means for covering said accessing means, said covering means capable of rotating to obtain an open position and a closed position, wherein said covering means includes at least one extension with a generally arced surface suitable for being accepted into said accepting means, wherein the at least one extension includes tapers on two surfaces of the extension generally perpendicular to the arced surface, wherein the accepting means includes corresponding tapered structures for accepting the at least one extension; and
a securing means capable of securing said covering means to said containing means in the closed position.

8. The removable access panel system of claim 7, further comprising a means for aligning the covering means to the containing means.

9. The removable access panel system of claim 7, wherein rotation of the covering means into an open position results in the at least one extension being removed from the accepting means.

10. The removable access panel system of claim 7, wherein the securing means is disposed on an opposite end of the covering means than the at least one extension.

11. A removable self-extracting panel system, comprising:
a frame for containing an electronic component, said frame including an aperture therein, said frame further including at least one pocket adjacent to said aperture, wherein said at least one pocket includes an arced surface protruding generally into said at least one pocket from a side of said at least one pocket generally opposite the aperture, whereby the innermost protrusion of the arced surface occurs at the outer surface of the frame;
a panel door for rotating to obtain an open position and a closed position, the panel door including:
at least one extension with a generally arced surface for being accepted into said at least one pocket, wherein the at least one extension includes a taper on a side of the extension generally perpendicular to the arced surface, wherein said at least one pocket includes corresponding tapered structures for accepting the at least one extension; and
a securing mechanism for securing the panel door to the frame in the closed orientation;
wherein the generally arced surface included in the at least one extension correspondingly mates with the arched surface included in the pocket such that the panel door slidingly rotates about the arched portion of the pocket to form a hinge for extracting the at least one extension upon rotation into an open position.

* * * * *